United States Patent
Fujino et al.

(10) Patent No.: US 11,656,282 B2
(45) Date of Patent: May 23, 2023

(54) ENERGY STORAGE DEVICE MANAGEMENT APPARATUS AND ENERGY STORAGE DEVICE MANAGEMENT METHOD

(71) Applicant: GS Yuasa International Ltd., Kyoto (JP)

(72) Inventors: Yukiko Fujino, Kyoto (JP); Yuta Kashiwa, Kyoto (JP); Yuki Sugiyama, Kyoto (JP); Takanobu Araki, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 237 days.

(21) Appl. No.: 16/498,317

(22) PCT Filed: Mar. 26, 2018

(86) PCT No.: PCT/JP2018/012037
§ 371 (c)(1),
(2) Date: Sep. 26, 2019

(87) PCT Pub. No.: WO2018/181129
PCT Pub. Date: Oct. 4, 2018

(65) Prior Publication Data
US 2021/0103000 A1    Apr. 8, 2021

(30) Foreign Application Priority Data
Mar. 31, 2017  (JP) .............................. JP2017-069840

(51) Int. Cl.
*G01R 31/367*    (2019.01)
*H02J 7/00*      (2006.01)
(Continued)

(52) U.S. Cl.
CPC ......... *G01R 31/367* (2019.01); *G01R 31/388* (2019.01); *G01R 31/392* (2019.01);
(Continued)

(58) Field of Classification Search
CPC .. G01R 31/367; G01R 31/392; G01R 31/388; G01R 31/3828; H02J 7/0048;
(Continued)

(56) References Cited

U.S. PATENT DOCUMENTS 6,127,806 A    10/2000  Tanjo et al.
9,429,626 B2    8/2016  Shiraishi et al.
(Continued)

FOREIGN PATENT DOCUMENTS

CN    103389466 A    11/2013
CN    104101838 A    10/2014
(Continued)

OTHER PUBLICATIONS

International Search Report (ISR) (PCT Form PCT/ISA/210), in PCT/JP2018/012037, dated Jun. 19, 2018.

*Primary Examiner* — Lee E Rodak
*Assistant Examiner* — Trung Q Nguyen
(74) *Attorney, Agent, or Firm* — McGinn I.P. Law Group, PLLC.

(57) ABSTRACT

Based on a voltage of a secondary battery detected by a voltage measurement unit, a residual capacity is acquired from a correlation between the voltage and the residual capacity of the secondary battery stored in a memory, and a state of charge (SOC) which is a ratio of the residual capacity to a reference capacity is obtained. The reference capacity is set to a prescribed amount less than a residual capacity at full charge. Further, an information processing
(Continued)

unit determines an abnormality of a module based on a comparison between the SOC and an SOC obtained by another method.

23 Claims, 7 Drawing Sheets

(51) Int. Cl.
   *H01M 10/48* (2006.01)
   *G01R 31/392* (2019.01)
   *G01R 31/388* (2019.01)

(52) U.S. Cl.
   CPC .......... *H01M 10/48* (2013.01); *H02J 7/0048* (2020.01); *H01M 2220/20* (2013.01)

(58) Field of Classification Search
   CPC .. H02J 7/0029; H01M 10/48; H01M 2220/20; B60L 58/13; B60L 2240/549; B60L 2240/423; Y02T 10/7072; Y02E 60/10
   USPC .................. 324/400–426, 400–435; 320/134
   See application file for complete search history.

(56) References Cited

U.S. PATENT DOCUMENTS

| | | | |
|---|---|---|---|
| 2010/0244886 | A1 | 9/2010 | Kawahara et al. |
| 2012/0133331 | A1* | 5/2012 | Ling .................... G01R 31/367 320/132 |
| 2012/0133332 | A1* | 5/2012 | Ogane .................. H02J 7/0029 903/903 |
| 2015/0127280 | A1 | 5/2015 | Baba et al. |
| 2016/0372800 | A1* | 12/2016 | Kanada .................... B60L 58/14 |
| 2018/0236891 | A1* | 8/2018 | Suzuki .................... B60L 58/12 |

FOREIGN PATENT DOCUMENTS

| | | |
|---|---|---|
| JP | H11-326472 A | 11/1999 |
| JP | 2009-104983 A | 5/2009 |
| JP | 2010-256323 A | 11/2010 |
| JP | 2013-238402 A | 11/2013 |

* cited by examiner

Charge capacity (Ah)

ENERGY STORAGE DEVICE MANAGEMENT APPARATUS AND ENERGY STORAGE DEVICE MANAGEMENT METHOD

TECHNICAL FIELD

A technology disclosed in the present specification acquires a state of charge (SOC) of an energy storage device such as a lithium ion battery and predicts aging characteristics of the SOC, to predict deterioration in the energy storage device or make notification to a user based on the information of the deterioration prediction.

BACKGROUND ART

Energy storage devices such as secondary batteries are in wide use for vehicles such as electric vehicles and also as stationary energy storage apparatuses for houses or power leveling. Thus, it is highly necessary to always know an accurate SOC (how much rate to a full-charge state) of each of the energy storage devices. One example of a method for acquiring the SOC is an OCV method. This is to obtain the SOC by using the fact that there is a relatively accurate correlation between an open circuit voltage (OCV) and a residual capacity of a battery, as in a technique described in JP-A-2009-104983 which is listed below. Specifically, a battery voltage at the time when no current is flowing in the battery, that is, an open circuit voltage, is measured, and a residual capacity corresponding to the measured OCV is obtained referring to a correlation between an OCV and a residual capacity measured and stored in advance. Then, the residual capacity is divided by a capacity at full charge to acquire the SOC (%).

PRIOR ART DOCUMENT

Patent Document

Patent Document 1: JP-A-2009-104983

SUMMARY OF THE INVENTION

Problems to be Solved by the Invention

According to a study conducted by the present inventors, a phenomenon has been found that, due to a gradual change in the correlation between the OCV and the residual capacity with deterioration in the battery or the like, when the SOC is calculated assuming that the correlation remains unchanged, the accuracy in the SOC calculation deteriorates. For example, in a lithium ion battery using an iron phosphate-based positive active material such as LiFePO4 and using soft carbon as a negative active material, the correlation has changed as shown in FIG. 1. That is, when an initial OCV-residual capacity characteristic was indicated by the solid line, the characteristic has changed after cycle tests of 750 hours, 1500 hours, 2250 hours, 3000 hours, and 3750 hours, respectively. When the SOC is calculated based on this and the OCV-SOC correlation is drawn, the correlation in the initial battery is just as indicated by the solid line in FIG. 2, and for example, the correlation in the battery after the 2250-hour cycle test becomes as indicated by the broken line. It is apparent that in the OCV method, an error of the SOC increases especially in a high capacity region due to the deterioration in the battery.

The reason for this is, for example, in the lithium ion battery using the iron phosphate-based positive active material, a region in which the positive electrode potential does not change depending on the discharge capacity is wide. Thus, it is considered that deterioration in a negative electrode directly leads to a decrease in capacity.

The present specification discloses a technique in which an accurate SOC can be acquired even when an energy storage device deteriorates and discloses an application of predicting the deterioration based on the accurate SOC estimation and notifying the user of the prediction.

Means for Solving the Problems

An energy storage device management apparatus disclosed in the present specification includes a voltage sensor that detects a voltage of an energy storage device, a memory in which information on a correlation between the voltage and a residual capacity of the energy storage device is stored, and an information processing unit. The information processing unit acquires the residual capacity from the correlation between the voltage and the residual capacity of the energy storage device stored in the memory based on the voltage of the energy storage device detected by the voltage sensor, and obtains a state of charge based on a ratio of the residual capacity and a reference capacity set to a predetermined amount less than a residual capacity at a full charge, of the energy storage device. The information processing unit further determines a state of the energy storage device based on a comparison between the state of charge and a state of charge obtained by another method.

In the memory, information on a correlation between an SOC, which is a ratio of the residual capacity to the reference capacity, and the voltage of the energy storage device may be stored. This enables the SOC to be acquired directly based on the voltage of the energy storage device.

Advantages of the Invention

According to the technology disclosed in the present specification, it is possible to predict deterioration based on accurate SOC estimation.

MODES FOR CARRYING OUT THE INVENTION

Summary of the Embodiment

An energy storage device management apparatus disclosed in the present specification includes, a voltage sensor that detects a voltage of an energy storage device, a memory in which information on a correlation between the voltage and a residual capacity of the energy storage device is stored, and an information processing unit. The information processing unit acquires the residual capacity from the correlation between the voltage and the residual capacity of the energy storage device stored in the memory based on the voltage of the energy storage device detected by the voltage sensor, and obtains a state of charge based on a ratio (rate) of the residual capacity and a reference capacity set to a predetermined amount less than a residual capacity at a full charge of the energy storage device. The information processing unit further determines a state of the energy storage device based on a comparison between the state of charge and a state of charge obtained by another method.

In the memory, information on a correlation between an SOC, which is a ratio of the residual capacity to the reference capacity, and the voltage of the energy storage device may be stored. This enables the SOC to be acquired directly based on the voltage of the energy storage device.

The energy storage device may be a lithium ion secondary battery using lithium iron phosphate as a positive active material, and a negative active material may be amorphous carbon. This is because in the lithium ion secondary battery using these active materials, the change in the OCV-residual capacity characteristic due to deterioration is large.

When the reference capacity is appropriately set in this manner, the change in the OCV-residual capacity characteristic is small even when the energy storage device deteriorates, and as a result, the SOC can be accurately determined.

Details of Embodiment

Hereinafter, an embodiment in which the technology disclosed in the present specification is applied to a battery module for driving an electric vehicle will be described in detail with reference to the drawings.

Figure 4:
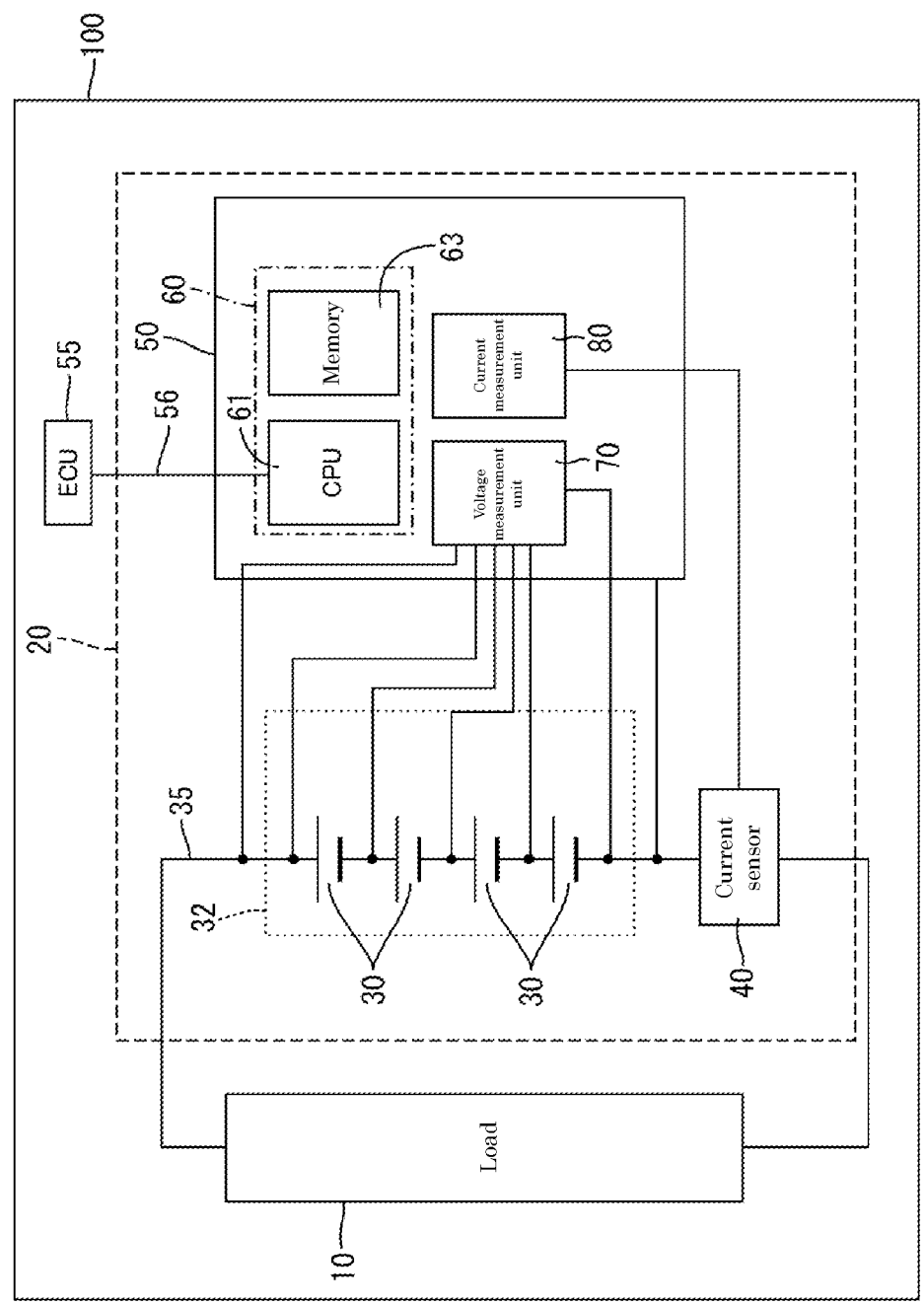
FIG. 4 is a block diagram showing a secondary battery module of an embodiment.

As shown in FIG. 4, the battery module of the present embodiment includes a plurality of secondary batteries 30 connected in series, a battery manager (hereinafter referred to as BM) 50 that manages the secondary batteries 30, and a current sensor 40 that detects a current flowing in the each of secondary batteries 30. The BM 50 is an example of an "energy storage device management apparatus."

The secondary battery 30 is an example of an "energy storage device", is charged by a charger (not shown), and supplies direct-current (DC) power to an inverter (shown as a load 10) that drives a motor for driving a vehicle. The secondary battery 30 is a lithium ion battery using LiFePO4 as a positive active material and amorphous carbon as a negative active material.

Regarding the secondary battery 30, it has been found that there is a correlation between an open circuit voltage (OCV) and a state of charge (SOC) defined as described later (herein referred to as "OCV-SOC correlation"), and the information in which the relationship is tabulated is stored in a memory 63.

The BM 50 includes a controller 60, a voltage measurement unit 70 that measures a voltage across each cell of the secondary battery 30, and a current measurement unit 80 that measures the current flowing in the secondary battery 30 based on a signal from the current sensor 40. The controller 60 includes a memory 63 and a central processing unit (hereinafter referred to as CPU) 61 as the information processing unit. The memory 63 stores various programs for controlling the operation of the BM 50 in addition to the above OCV-SOC correlation, and the CPU 61 determines the SOC in accordance with the program read from the memory 63.

(OCV-SOC Correlation of Secondary Battery 30)

The SOC of a secondary battery is generally defined as a ratio (%) of the residual capacity of the secondary battery to the full-charge capacity at a certain time point, but in the technology disclosed in the present specification, the SOC is defined as the ratio (%) of the residual capacity of the secondary battery 30 at a certain time point to a "reference capacity" that is not the full-charge capacity but is a "reference capacity" less than the full-charge capacity. The SOC based on this definition will be referred to as a "converted SOC." In the secondary battery 30 of the present embodiment, an OCV at the full-charge capacity is V1, and an OCV corresponding to the reference capacity is V2. The OCV-converted SOC correlation of the secondary battery 30 is measured in advance as follows.

For the full charge, the constant voltage charge of V1 is performed three hours after a charge of 1 C. For the charge to the reference capacity, the V2-constant voltage charge is performed three hours after a charge of 1 C. The OCV is acquired by: (1) charging one-tenth of the capacity concerning each of the secondary batteries 30 with the full-charge capacity and the reference capacity is charged at 10 A and 25° C.; and (2) leaving the batteries for four hours and averaging voltages for the last 30 minutes. By repeating (1) and (2) ten times, it is possible to measure the OCV-SOC correlation of the secondary battery 30. The tenth charge is the constant current constant voltage charge of V1 or V2.

When the secondary battery 30 deteriorates, the full-charge capacity of the secondary battery 30 decreases. The longer a period of use of the secondary battery 30 and the more the battery deteriorates, the smaller the full-charge capacity of the secondary battery 30 (each cell) becomes until the voltage of the secondary battery 30 reaches V1 being the full-charge voltage.

Figure 2:
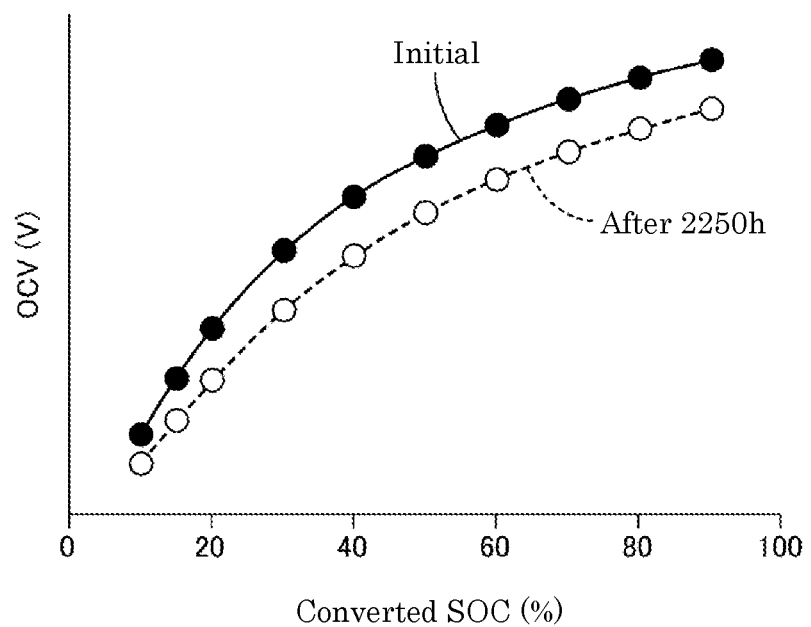
FIG. 2 is a graph showing OCV-SOC characteristics changed by the cycle tests.

The SOC is conventionally obtained by dividing the current charge capacity of the secondary battery by the full-charge capacity. Therefore, when the OCV of the secondary battery is the same, the SOC of the secondary battery with its battery performance having deteriorated is estimated to be large as compared to the SOC in the initial state of the battery. For example, when the measured cell voltage of the secondary battery 30 is V3 lower than V2, the SOC is estimated to be about 40% in the initial state of the secondary battery 30, as is apparent from FIG. 2, whereas in the secondary battery 30 with its battery performance having deteriorated, the SOC is estimated to be about 50%.

Figure 1:
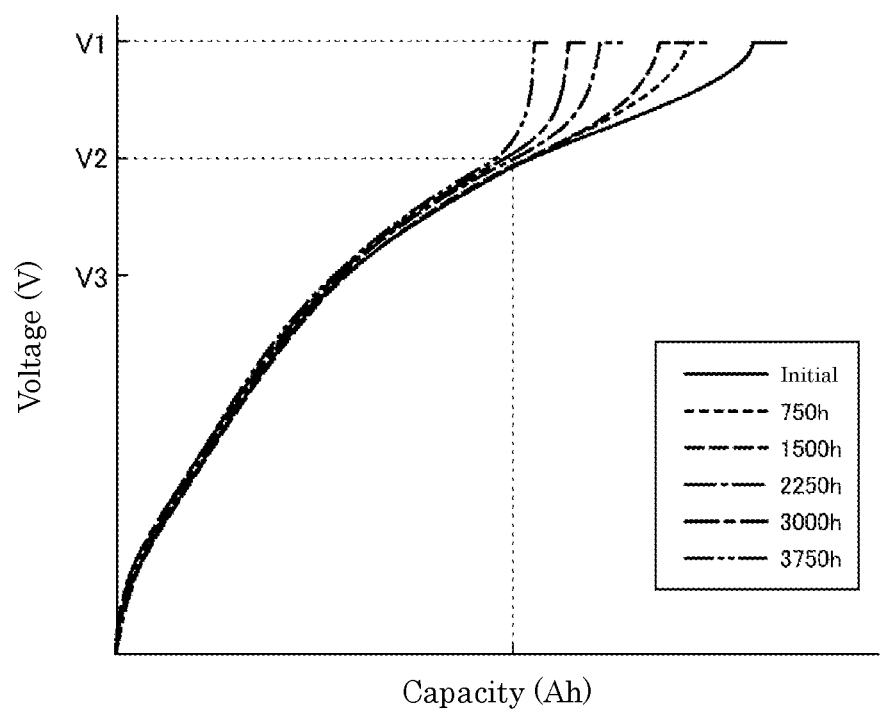
FIG. 1 is a graph showing changes in capacity of a lithium ion battery made by cycle tests.

On the other hand, as shown in FIG. 1, even when a comparison is made for the partial charge capacity (reference capacity) until the voltage of the secondary battery 30 reaches V2 between the initial state of the secondary battery 30 and after repetition of the charge-discharge for the time described in the same figure, the error of the change in the charge capacity due to the deterioration of the secondary battery 6 is equal to or less than a reference value. That is, focusing on the OCV-converted SOC characteristic of the secondary battery 30, there is almost no difference in characteristic between the initial state of the secondary battery 6 and after the repetition of the charge-discharge.

Figure 5:
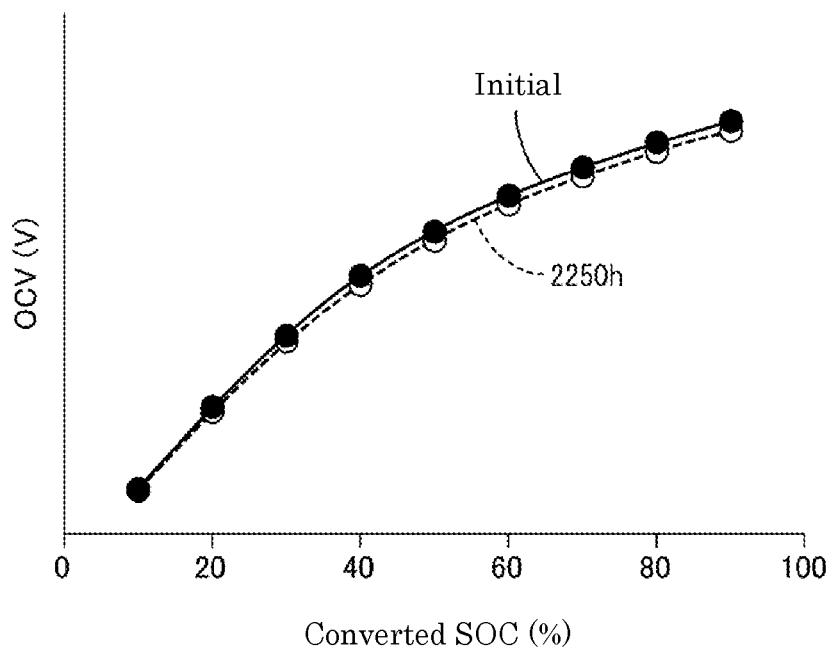
FIG. 5 is a graph showing an OCV-SOC correlation of the secondary battery of the embodiment.

In the present embodiment, the converted SOC is defined using this reference capacity. That is, the converted SOC of the secondary battery 30 at the reference capacity (OCV=V2) is defined as 100%. As a result, the OCV-converted SOC correlation of the present embodiment is as shown in FIG. 5. The solid line shows an initial product of the secondary battery 30, and the broken line shows a secondary battery 30 after a cycle test of 2250 hours, for example. As is apparent from the figure, the SOC can be accurately determined from the OCV regardless of whether or not the secondary battery 30 has deteriorated. Thereby, effects as follows are exerted.

When BM 50 is applied to an in-vehicle battery module, the accuracy in calculation of an electric vehicle (EV) travelable distance is improved.

The secondary battery 30 can be prevented from running out.

When the usable capacity of the secondary battery 30 is small, it is not necessary to have an extra reserve for preventing the reduction in battery life, so that a region used for the secondary battery 30 can be set.

For the secondary battery 30 of the present embodiment, the following test batteries A, B were prototyped, and the OCV-charge capacity (Ah) characteristic was measured similarly to the above description. This is to confirm the influence on the SOC error due to variation in the coating amount of the active material.

Test battery A: The coating amount of the positive active material was set to +several % relative to a design value, and the coating amount of the negative active material was set to −several % relative to the design value.

Test battery B: The coating amount of the positive active material was set to −several % relative to a design value, and the coating amount of the negative active material was set to +several % relative to the design value.

Figure 6:
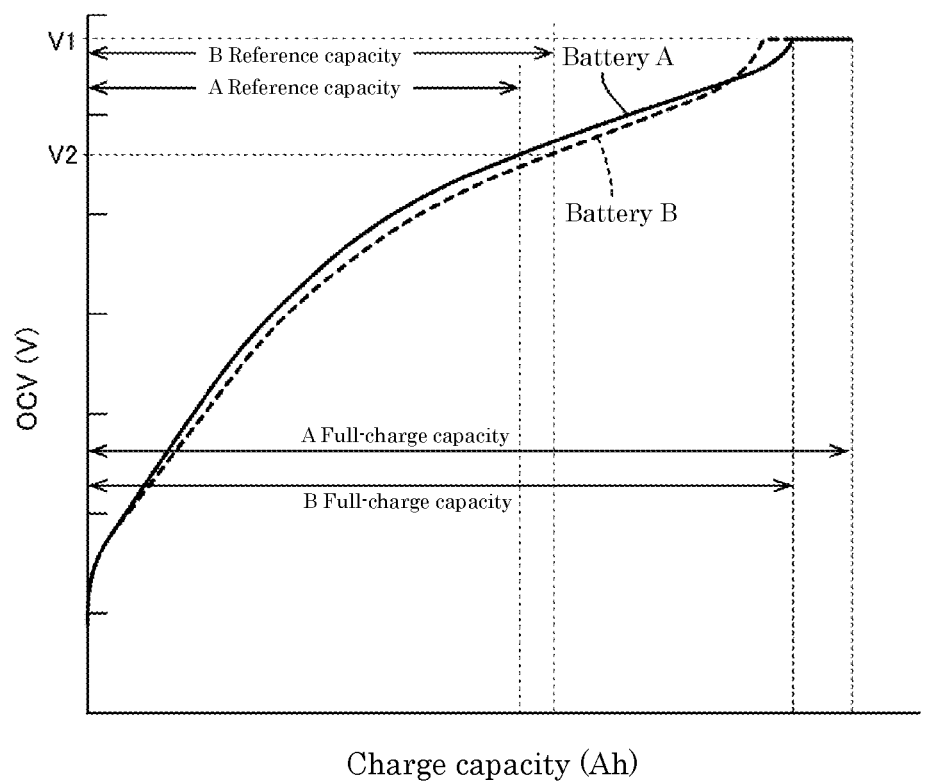
FIG. 6 is a graph showing a correlation between an OCV-charge capacity of each of batteries A, B in the embodiment.

The OCV-charge capacity characteristics of both batteries A, B were as shown in FIG. 6. The full-charge capacity (OCV=V1) depends on the positive electrode coating amount and is greater for the battery A and smaller for the battery B. On the other hand, the reference capacity (OCV=V2) depends on the negative electrode coating amount and is, on the contrary to the above, greater for the battery B and smaller for the battery A.

Figure 7:
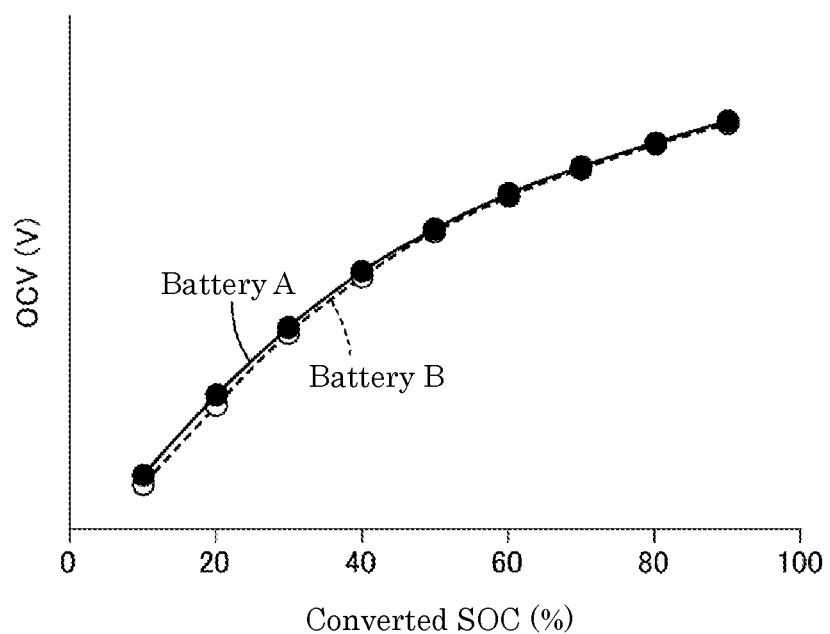
FIG. 7 is a graph showing an OCV-SOC correlation between each of the batteries A, B in the embodiment.

When the ratio between the residual capacity and the reference capacity is defined as the converted SOC and the OCV-converted SOC correlation is drawn, the correlation is as shown in FIG. 7, and it can be seen that there is almost no difference between the batteries A, B. This means that, when assumed to be the definition of the converted SOC of the present embodiment, the SOC error due to manufacturing variation can be prevented.

Figure 3:
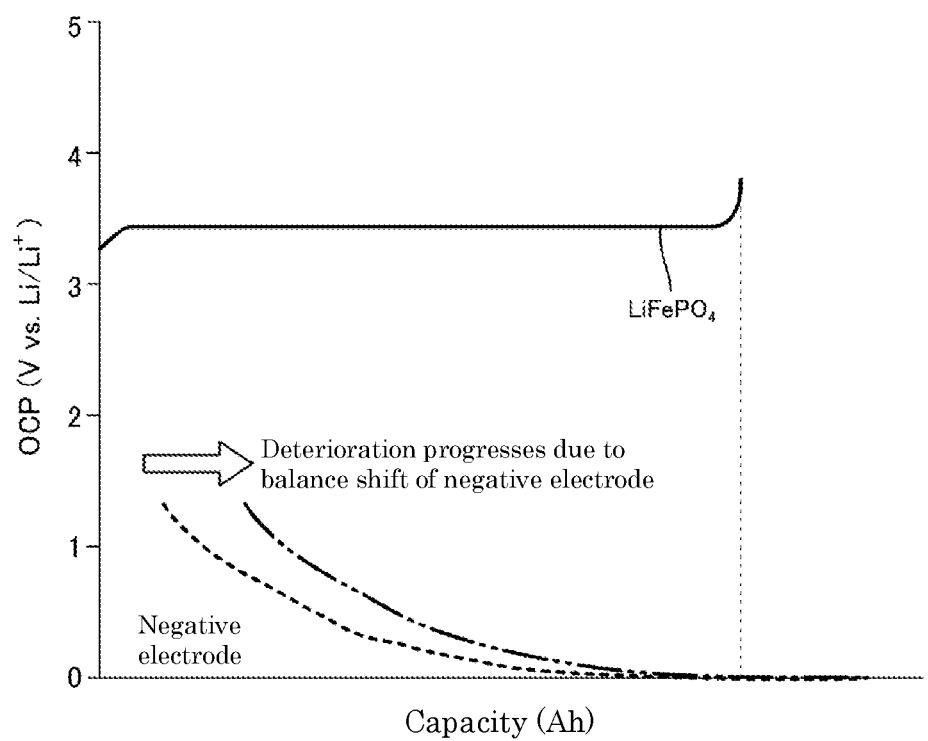
FIG. 3 is a graph showing the relationship between a unipolar potential and the capacity of the lithium ion battery.

Although the "reference capacity" of the present embodiment is a value less than the full-charge capacity, in the present embodiment where the technology of the present specification has been provided to a lithium ion battery using LiFePO4 as a positive active material and amorphous carbon as a negative active material, the maximum charging capacity at which the cell voltage of the secondary battery 30 is V2 is set as the "reference capacity." A specific numerical value of the reference capacity may vary depending on the type of the active material. A capacity change made by the cycle test may be measured and determined as the maximum charge capacity in a region where the capacity is unlikely to deteriorate as shown in FIG. 1. As shown in FIG. 3, for the iron phosphate-based positive active material, a flat region is wide in the correlation between the battery voltage and the capacity. For this reason, considering that the deterioration progresses due to the balance shift of the negative electrode in the region, the setting can also be set to the maximum capacity corresponding to the OCV (V2 in the present embodiment) in the flat region.

When the "reference capacity" is set to a value less than the full-charge capacity in accordance with the type of the active material, the SOC error can be reduced. However, the value is not limited to being fixed constantly but may be gradually changed to a smaller value as the battery deteriorates.

In the present embodiment, the case of using the lithium ion battery described above as the energy storage device has been described. However, the present invention is not limited to this but may be a battery using another positive active material or another negative active material or may be applied to a capacitor with an electrochemical reaction.

Next, examples of another positive active material or another negative active material will be cited. For example, as a combination of the positive active material and the negative active material, in a graph where the vertical axis is unipolar potential and the horizontal axis is capacity as in FIG. 3, a combination is conceivable between a graph shape in which the positive electrode includes a flat region (or a nearly flat region) and a graph shape in which the negative electrode includes a change region (in other words, a tilted region) (a combination in which the graph shape changes more than other SOC regions in the SOC-OCV curve on the high SOC side depending on the degree of deterioration). Examples of the active material as the positive active material include a phosphate-based positive active material (its iron part is Mn, Co, Ni) and SiO4, PO4, and P2O7 in addition to phosphate. Examples as the negative active material include non-graphitizable carbon and graphitizable carbon.

In a graph where the vertical axis is unipolar potential and the horizontal axis is capacity, a combination is conceivable between a graph shape in which the positive electrode includes a change region (in other words, a tilted region) and a graph shape in which the negative electrode includes a flat region (or a nearly flat region) (a combination in which the graph shape changes more than other SOC regions in the SOC-OCV curve on the low SOC side depending on the degree of deterioration). Examples of the active material as the positive active material include a layered oxide-based positive electrode. Examples as the negative active material include Gr, Si, and SiO.

In the above embodiment, the tabulated information on the correlation (OCV-converted SOC characteristic) between the cell voltage and the SOC (the ratio of the residual capacity to the reference capacity) has been stored into the memory 63 of BM 50, and the converted SOC has immediately been determined from the OCV with reference to the information. However, the present invention is not limited to this, but information on the correlation between the cell voltage and the residual capacity may be stored into the memory, the residual capacity may be determined from the OCV with reference to the information, and the residual capacity may be divided by the reference capacity to determine the converted SOC.

The information stored into the memory is not limited to the tabulated information on the correlation, but a mathematical expression that represents the converted SOC or the residual capacity may be stored as a function of the cell voltage, and a cell voltage may be input into the function to calculate the converted SOC or the like.

As described above, in the present invention, the residual capacity has been obtained from the correlation between the voltage and the residual capacity of the energy storage device, and the ratio of the reference capacity of the residual capacity (set to a predetermined amount less than the residual capacity at full charge) is obtained, so that a converted SOC with a small error can be calculated. A description will be given of a method for estimating the deterioration (prediction) in energy storage device, diagnosing (determining) the deterioration, and making notification to a user or the like by using the converted SOC.

When the converted SOC is 100% or less, the voltage value and the converted SOC of the energy storage device have a substantially one-to-one relationship regardless of the number of charge-discharge cycles of the energy storage device (and hence the deterioration in the energy storage device). In the region where the converted SOC is 100% or less, for example, the respective voltages of the energy storage device are measured at two time points of times t1, t2 to acquire two converted SOC values, and a difference ΔSOC therebetween is calculated (this is taken as ΔSOC(v)). On the other hand, the current flow into and out of the energy storage device between the times t1 and t2 is measured and integrated to calculate the SOC change between both times t1 and t2 (this is taken as ΔSOC(i)). This method is known as a method for calculating the SOC change by a current integration method.

When the two changes in SOC (ΔSOC(v), ΔSOC(i)) are compared and the difference between the two changes is equal to or more than a predetermined value, it is possible to determine that at least any portion is abnormal, like the energy storage device is abnormal, the energy storage device has deteriorated, a probe such as a sensor (probe) is abnormal, or the processing unit is abnormal.

By notifying the determination result to the outside or notifying the user, it is possible to appropriately deal with the malfunction, replace the energy storage device, and the like.

In FIG. 1, for example, in a region where the SOC as a ratio to a predetermined capacity such as a reference capacity (OCV=V2) is 1 (or 100%) or more, it can be seen that the relationship between the voltage and capacity of the energy storage device changes depending on the number of charge-discharge cycles (i.e., deterioration in the energy storage device). That is, as shown in FIG. 1, there is a phenomenon that a capacity at which the voltage on the vertical axis suddenly changes (rapidly increases) decreases depending on the number of cycles of the energy storage device (deterioration in the energy storage device). Therefore, by measuring a value at which the amount of change in the voltage value of the energy storage device relative to the amount of change in the state of charge, it is possible to determine the state of the energy storage device (e.g., an abnormality of the energy storage device, estimation (prediction) of deterioration in the energy storage device, the life (replacement time) of the energy storage device, etc.). Specifically, by comparing a voltage change value per capacity change (ΔV/ΔAh) with a predetermined threshold value, it is possible to numerically determine the degree to which the energy storage device has completely deteriorated or has approached the complete deterioration.

Using this determination as a trigger, it is possible to determine the state of the energy storage device (e.g., an abnormality of the energy storage device, estimation (prediction) of deterioration in the energy storage device, the life (replacement time) of the energy storage device, etc.) and notify the determination to the user and external equipment. It is possible to make an appropriate determination on the notification.

As for the notification, the notification may be made using a certain threshold as a determination material, or the notification may be made in stages by providing a plurality of thresholds. For example, when the determination is to be made with the voltage value, the determination may be made with a plurality of voltage values. In the amount of change in the voltage value of the energy storage device relative to the amount of change in the state of charge, a plurality of amounts of change may be provided as threshold values. Upon receipt of the stepwise notification in this manner, an appropriate determination may be made in stages. By making stepwise notification to the user, for example, the energy storage device is approaching the end of its life, the replacement time of the energy storage device nears, the energy storage device is at the end of its life, replace the energy storage device, contact a dealer (shop), stop the use, the user can take appropriate measures such as replacement of the energy storage device, without panicking. The notification may be made not only to the user but also to the dealer (manufacturer) using communication.

Other methods for determining the state of the energy storage device are also conceivable. For example, with the energy storage device set to a state detection mode (the detection mode is activated at a time specified by the user or in every predetermined period), the voltage value may be increased to a value that can be taken when the converted SOC is 100% or more, and the state of the energy storage device may be determined from a change in the voltage value.

Specifically, a voltage change value during a certain predetermined period may be acquired, and the state of the energy storage device may be determined from the magnitude of the change. For example, the energy storage device is operated in the state detection mode. Under a condition that the voltage value is increased to the voltage V2 or higher in FIG. 1, a voltage change value in a certain predetermined period is acquired, and the state of the energy storage device is determined based on the voltage change value. Alternatively, a voltage change value at a certain capacity change (ΔV/ΔAh) may be acquired. In this case, the current integration method may be used for the capacity change. In the determination on these voltage change values, a reference voltage change value (e.g., a voltage change value of an energy storage device that has not substantially deteriorated) may be acquired in advance and compared with a voltage change value acquired this time (e.g., a predetermined value is set and the comparison is made). The predetermined threshold may be an immediate previous voltage change value. As described above, in the determination of these voltage change values, some categories may be classified, and stepwise notification (detection) may be received, to make an appropriate decision in stages. For example, the following notification is made: the energy storage device is approaching the end of its life, the replacement time of the energy storage device nears, the energy storage device is at the end of its life, replace the energy storage device, contact a dealer (shop), stop the use, and the like.

From the above, the state of the energy storage device is understood in advance on the dealer (manufacturer) side or notified to the user, so that not only sudden failures and malfunctions can be avoided, but also advance preparation for maintenance can be made both on the dealer (manufacturer) side and the user side. It is possible to check inventory of spare parts, acquire the spare parts, prepare for transportation thereof, ensure maintenance personnel, and the like in advance, and the dealer (manufacturer) can provide smooth services to the user. Alternatively, the dealer (manufacturer) side can acquire a large amount of information on the deterioration characteristics of the energy storage device and the characteristics of the energy storage devices at the time of replacement of the energy storage device. It is thereby possible to provide a new service by estimating the state of the energy storage device using big data, for example.

The present technology is not limited to automobiles or motorcycles. The present invention can be applied in a wide range of fields using storage batteries, such as railway vehicles, port transportation vehicles (systems), industrial batteries, power supply units, and household storage systems. The present technology is also applicable to incorporation into fault diagnosis equipment and chargers.

From the embodiment described above, the following may be possible.

(Configuration Example 1) An energy storage device management apparatus including: a voltage sensor that detects a voltage of an energy storage device; a memory in which information on a correlation between the voltage and a residual capacity of the energy storage device is stored; and an information processing unit. The information processing unit acquires the residual capacity from the correlation between the voltage and the residual capacity of the energy storage device stored in the memory based on the voltage of the energy storage device detected by the voltage sensor, and calculates a ratio of the residual capacity to a reference capacity, and the reference capacity is set to a predetermined amount less than a residual capacity at full charge.

(Configuration Example 2) An energy storage device management apparatus including: a voltage sensor that detects a voltage of an energy storage device; a memory in which information on a correlation between the voltage of the energy storage device and a state of charge, which is a ratio of a residual capacity to a reference capacity, is stored; and an information processing unit. The information processing unit acquires the state of charge from the correlation between the voltage and the residual capacity of the energy storage device stored in the memory based on the voltage of the energy storage device detected by the voltage sensor, and the reference capacity is set to a predetermined amount less than a residual capacity at full charge.

(Configuration Example 3) The energy storage device management apparatus in which the energy storage device is a lithium ion secondary battery using lithium iron phosphate as a positive active material.

(Configuration Example 4) The energy storage device management apparatus in which the energy storage device is a lithium ion secondary battery using soft carbon as a negative active material.

(Configuration Example 5) A power storage module including: a storage element; and the energy storage device management apparatus according to any one of the above configuration examples.

According to Configuration Examples 1 to 5 as above, an accurate SOC can be acquired even when the performance of the energy storage device degrades.

(Configuration Example 6) An energy storage device management method including determining a state of an energy storage device based on that a voltage value of the energy storage device at a predetermined value of the reference capacity is a predetermined value or is a predetermined value or more.

(Configuration Example 7) An energy storage device management method further including determining the state of the energy storage device from a physical quantity related to a voltage value of the energy storage device in a predetermined capacity more than the reference capacity and less than the residual capacity at the full charge of the energy storage device.

(Configuration Example 8) An energy storage device management method further including determining the state of the energy storage device from the voltage value of the energy storage device in a predetermined capacity more than the reference capacity and less than the residual capacity at the full charge of the energy storage device.

(Configuration Example 9) An energy storage device management method further including determining the state of the energy storage device from an amount of change in a voltage value of the energy storage device relative to an amount of change in the state of charge in a predetermined capacity more than the reference capacity and less than the residual capacity at the full charge.

(Configuration Example 10) An energy storage device management method further including: acquiring the state of charge from the correlation between the voltage and the residual capacity of the energy storage device; and not using the energy storage device in the state of charge where the voltage value of the energy storage device is equal to or more than a predetermined value.

(Configuration Example 11) An energy storage device management method further including determining the state of the energy storage device from the amount of change in the voltage value of the energy storage device relative to the amount of change in the state of charge.

According to the configurations in Configuration Examples 6 to 11, it is possible to notify the user that the energy storage device is in a state where normal use is impaired or desired performance cannot be acquired due to degradation in performance of the energy storage device. It is thus possible to take appropriate measures such as replacement of the energy storage device or suspension of use.

DESCRIPTION OF REFERENCE SIGNS

20: battery module
30: secondary battery (energy storage device)
40: current sensor
50: battery-manager
60: controller
61: CPU (information processing unit)
63: memory
70: voltage measurement unit (voltage sensor)

The invention claimed is:

1. An energy storage device management apparatus, comprising:
   a voltage sensor that detects a voltage of an energy storage device;
   a memory in which information on a correlation between the voltage and a residual capacity of the energy storage device or information on a correlation between the voltage and a converted state of charge (SOC), which is a ratio of the residual capacity to a reference capacity, is stored, the reference capacity being set to a predetermined amount less than the residual capacity at a full charge of the energy storage device; and
   an information processing unit,
   wherein the information processing unit obtains a state of charge of the energy storage device based on the voltage detected by the voltage sensor and the information stored in the memory, and
   wherein the information processing unit determines, in a region that the energy storage device has a capacity equal to or less than the reference capacity, where the capacity is less likely to deteriorate, a state of the energy storage device based on a comparison between the state of charge and a state of charge obtained by another method.

2. The energy storage device management apparatus according to claim 1, wherein the state of charge obtained by the another method is a state of charge integrated based on measurement of current input into or output from the energy storage device.

3. The energy storage device management apparatus according to claim 1, wherein the information processing unit further determines the state of the energy storage device from an amount of change in a voltage value of the energy storage device relative to an amount of change in the state of charge in a predetermined capacity more than the reference capacity and less than the residual capacity at the full charge of the energy storage device.

4. The energy storage device management apparatus according to claim 1, wherein the energy storage device comprises a lithium ion secondary battery including lithium iron phosphate as a positive active material.

5. The energy storage device management apparatus according to claim 4, wherein the lithium ion secondary battery includes soft carbon as a negative active material.

6. The energy storage device management apparatus according to claim 1, wherein, in the memory, at least the information on the correlation between the voltage and the residual capacity of the energy storage device is stored.

7. The energy storage device management apparatus according to claim 1, wherein, in the memory, the information on the correlation between the voltage and the SOC is stored.

8. The energy storage device management apparatus according to claim 1, further comprising a first battery and a second battery, wherein the maximum charging capacity at which a cell voltage of the secondary battery is set as the reference capacity,
wherein the information processing unit determines, in the region of the second battery where the SOC as a ratio to a predetermined capacity such that the energy storage device has the capacity equal to or less than the reference capacity corresponding to the measurement of an open circuit voltage of the charge capacity, and
wherein the capacity is less likely to deteriorate, the state of the energy storage device based on the comparison between the state of charge and the state of charge obtain by the state of charge integrated based on measurement of current input into or output from the energy storage device.

9. The energy storage device management apparatus according to claim 1, wherein the information processing unit determines the state of the energy storage device from an amount of change in a voltage value of the energy storage device relative to an amount of change in the state of charge in a predetermined capacity more than the reference capacity and less than the residual capacity at the full charge in the region that the energy storage device has the capacity equal to or less than the reference capacity, from the measurement of the OCV (open circuit voltage)-charge capacity Ah),
wherein the capacity is less likely to deteriorate, the state of the energy storage device based on the comparison between the state of charge and the state of charge obtained by another method.

10. An energy storage device management method, comprising:
obtaining a state of charge of an energy storage device based on a voltage detected by a voltage sensor, and a ratio of a capacity obtained from the voltage of the energy storage device to a reference capacity set to a predetermined amount less than a full-charge capacity of the energy storage device; and
determining a state of the energy storage device based on a comparison between the state of charge in accordance with the capacity obtained from the voltage of the energy storage device and a state of charge obtained by another method in a region that the energy storage device has a capacity equal to or less than the reference capacity, where the capacity is less likely to deteriorate.

11. An energy storage device management apparatus, comprising:
a memory in which information on a correlation between a voltage and a residual capacity of an energy storage device or information on a correlation between the voltage and a converted state of charge (SOC), which is a ratio of the residual capacity to a reference capacity, is stored, the reference capacity being set to a predetermined amount less than the residual capacity at a full charge of the energy storage device; and
an information processing unit,
wherein the information processing unit obtains a state of charge of the energy storage device based on the voltage detected by the voltage sensor and the information stored in the memory, and
wherein the information processing unit determines, in a region that the energy storage device has a capacity equal to or less than the reference capacity, where the capacity is less likely to deteriorate, a state of the energy storage device based on a comparison between the state of charge and a state of charge obtained by another method.

12. The energy storage device management apparatus according to claim 11, wherein the energy storage device comprises a lithium ion secondary battery including lithium iron phosphate as a positive active material.

13. The energy storage device management apparatus according to claim 12, wherein the lithium ion secondary battery includes soft carbon as a negative active material.

14. The energy storage device management apparatus according to claim 11, wherein, in the memory, at least the information on the correlation between the voltage and the residual capacity of the energy storage device is stored.

15. The energy storage device management apparatus according to claim 11, wherein, in the memory, the information on the correlation between the voltage and the SOC is stored.

16. An energy storage device management apparatus, comprising:
a memory in which information on a correlation between a voltage and a residual capacity of an energy storage device or information on a correlation between the voltage and a converted state of charge (SOC), which is a ratio of the residual capacity to a reference capacity, is stored, the reference capacity being set to a predetermined amount less than the residual capacity at a full charge of the energy storage device; and
an information processing unit,
wherein the information processing unit obtains a state of charge of the energy storage device based on the voltage detected by the voltage sensor and the information stored in the memory, and
wherein the information processing unit determines, in a region that the energy storage device has a capacity equal to or less than the reference capacity, where the capacity is less likely to deteriorate, a state of the energy storage dev ice based on a comparison between a threshold acquired in advance and voltage value information of the energy storage device acquired from the voltage sensor in a state of charge more than a state of charge based on the ratio.

17. The energy storage device management apparatus according to claim 16, wherein the voltage value information comprises a voltage change value in a predetermined period or a voltage change value in a predetermined capacity change value.

18. The energy storage device management apparatus according to claim 16, wherein the energy storage device comprises a lithium ion secondary battery including lithium iron phosphate as a positive active material.

19. The energy storage device management apparatus according to claim 18, wherein the lithium ion secondary battery includes soft carbon as a negative active material.

20. The energy storage device management apparatus according to claim 16, wherein, in the memory, at least the information on the correlation between the voltage and the residual capacity of the energy storage device is stored.

21. The energy storage device management apparatus according to claim 16, wherein, in the memory, the information on the correlation between the voltage and the SOC is stored.

22. An energy storage device management method, comprising:
   obtaining a state of charge of an energy storage device based on a voltage detected by a voltage sensor, and a ratio of a capacity obtained from the voltage of the energy storage device to a reference capacity set to a predetermined amount less than a full-charge capacity of the energy storage device; and
   determining a state of the energy storage device based on a comparison between a threshold acquired in advance and voltage value information of the state of charge in a region more than a region in which the energy storage device has a capacity equal to or less than the reference capacity, where the capacity is less likely to deteriorate.

23. The energy storage device management method according to claim 22, wherein the ratio of the residual capacity to the reference capacity has been stored and the converted SOC has immediately been determined from the OCV with reference to the obtained information,
   wherein the determining the state of the energy storage device is from an amount of change in a voltage value of the energy storage device relative to an amount of change in the state of charge in a predetermined capacity more than the reference capacity and less than the residual capacity at the full charge,
   wherein the determining of the energy storage device is based on the comparison between the threshold acquired in advance and the voltage value information of the state of charge in the region where the converted SOC is 100% or less, in which the energy storage device has a capacity equal to or less than the reference capacity, from a measurement of the OCV (open circuit voltage)-charge capacity (Ah), where the capacity is less likely to deteriorate.

* * * * *